United States Patent
Guerin et al.

(10) Patent No.: US 9,417,298 B2
(45) Date of Patent: Aug. 16, 2016

(54) LOCAL SAR REDUCTION IN MULTI-SLICE PTX VIA SAR-HOPPING BETWEEN EXCITATIONS

(71) Applicants: Bastien Guerin, Cambridge, MA (US); Lawrence L. Wald, Boston, MA (US); Elfar Adalsteinsson, Belmont, MA (US)

(72) Inventors: Bastien Guerin, Cambridge, MA (US); Lawrence L. Wald, Boston, MA (US); Elfar Adalsteinsson, Belmont, MA (US)

(73) Assignee: The General Hospital Corporation, Boston, MA (US)

( * ) Notice: Subject to any disclaimer, the term of this patent is extended or adjusted under 35 U.S.C. 154(b) by 727 days.

(21) Appl. No.: 13/827,700

(22) Filed: Mar. 14, 2013

(65) Prior Publication Data

US 2013/0300414 A1  Nov. 14, 2013

Related U.S. Application Data

(60) Provisional application No. 61/644,839, filed on May 9, 2012.

(51) Int. Cl.
  *G01R 33/28* (2006.01)
  *G01R 33/561* (2006.01)
  *G01R 33/483* (2006.01)

(52) U.S. Cl.
  CPC .......... *G01R 33/288* (2013.01); *G01R 33/5612* (2013.01); *G01R 33/4835* (2013.01)

(58) Field of Classification Search
  CPC ............. G01R 33/288; G01R 33/5612; G01R 33/4835
  See application file for complete search history.

(56) References Cited

U.S. PATENT DOCUMENTS

| 5,237,273 | A | 8/1993 | Plewes et al. | |
|---|---|---|---|---|
| 5,422,572 | A | 6/1995 | Yao | |
| 8,102,177 | B2* | 1/2012 | McKinnon | G01R 33/288 324/307 |
| 8,148,985 | B2* | 4/2012 | Zelinski | G01R 33/288 324/309 |
| 8,193,967 | B2* | 6/2012 | Nguyen | G01S 7/414 342/190 |
| 8,653,818 | B2* | 2/2014 | Adalsteinsson | G01R 33/5612 324/307 |
| 9,075,129 | B2* | 7/2015 | Nguyen | G01S 7/414 |
| 2004/0181146 | A1 | 9/2004 | Yarnykh et al. | |
| 2011/0118587 | A1 | 5/2011 | Roemer et al. | |
| 2012/0013337 | A1 | 1/2012 | Graesslin et al. | |
| 2015/0273230 | A1* | 10/2015 | Guerin | A61N 1/403 607/101 |

OTHER PUBLICATIONS

Brunner, et al., Optimal Design of Multiple-Channel RF Pulses Under Strict Power and SAR Constraints, Magnetic Resonance in Medicine, 2010, 63:1280-1291.

(Continued)

*Primary Examiner* — Dixomara Vargas
(74) *Attorney, Agent, or Firm* — Quarles & Brady, LLP

(57) ABSTRACT

Described here are a system and method for designing radio frequency ("RF") pulses for parallel transmission ("pTx") applications, and particularly pTx applications in multislice magnetic resonance imaging ("MRI"). The concept of "SAR hopping" is implemented by framing the concept between slice-selective excitations as a constrained optimization problem that attempts designing multiple pulses simultaneously subject to an overall local SAR constraint. This results in the set of RF waveforms that yield the best excitation profiles for all pulses while ensuring that the local SAR of the average of all pulses is below the regulatory limit imposed by the FDA. Pulses are designed simultaneously while constraining local SAR, global SAR, and peak power, and average power explicitly.

19 Claims, 3 Drawing Sheets

(56) References Cited

OTHER PUBLICATIONS

Collins, et al., Temperature and SAR Calculations for a Human Head Within Volume and Surface Coils at 64 and 300 MHz, Journal of Magnetic Resonance Imaging, 2004, 19(5):650-656.

Eichfelder, et al., Local Specific Absorption Rate Control for Parallel Transmission by Virtual Observation Points, Magnetic Resonance in Medicine, 2011, 66(5):1468-1476.

Graesslin, et al., Local SAR Constrained Hotspot Reduction by Temporal Averaging, Proc. Intl. Soc. Mag. Reson. Med., 2010, 18:4932.

Homann, et al., Specific Absorption Rate Reduction in Parallel Transmission by k-space Adaptive Radiofrequency Pulse Design, Magnetic Resonance in Medicine, 2011, 65(2):350-357.

Kozlov, et al., Fast MRI Coil Analysis Based on 3-D Electromagnetic and RF Circuit Co-Simulation, Journal of Magnetic Resonance, 2009, 200(1):147-152.

Lee, J., et al., Local SAR in Parallel Transmission Pulse Design, Magnetic Resonance in Medicine, 2012, 67 (6):1566-1578.

Lemdiasov, et al., A Numerical Postprocessing Procedure for Analyzing Radio Frequency MRI Coils, Concepts in Magnetic Resonance Part A, 2011, 38A(4):133-147.

Sbrizzi, et al., Fast Design of Local N-Gram-Specific Absorption Rate-Optimized Radiofrequency Pulses for Parallel Transmit Systems, Magnetic Resonance in Medicine, 2012, 67(3):824-834.

Setsompop, et al., Parallel RF Transmission With Eight Channels at 3 Tesla, Magnetic Resonance in Medicine, 2006, 56:1163-1171.

Setsompop, et al., Slice-Selective RF Pulses for In-Vivo B1+ Inhomogeneity Mitigation at 7 Tesla Using Parallel RF Excitation with a 16-Element Coil, Magnetic Resonance in Medicine, 2008, 60(6):1422-1432.

Wang, et al., SAR and Temperature: Simulations and Comparison to Regulatory Limits for MRI, Journal of Magnetic Resonance Imaging, 2007, 26(2):437-441.

Wu, et al., Adapted RF Pulse Design for SAR Reduction in Parallel Excitation with Experimental Verification at 9.4 Tesla, J. Magn. Reson., 2010, 205(1):161-170.

Zhu, Parallel Excitation With an Array of Transmit Coils, Magnetic Resonance in Medicine, 2004, 51:775-784.

PCT International Search Report and Written Opinion, PCT/US2013/031521, Jul. 11, 2013, 6 pages.

\* cited by examiner

LOCAL SAR REDUCTION IN MULTI-SLICE PTX VIA SAR-HOPPING BETWEEN EXCITATIONS

CROSS-REFERENCE TO RELATED APPLICATIONS

This application claims the benefit of U.S. Provisional Patent Application Ser. No. 61/644,839, filed on May 9, 2012, and entitled "Local SAR reduction in multi-slice pTx via SAR-hopping between excitations."

STATEMENT REGARDING FEDERALLY SPONSORED RESEARCH

This invention was made with government support under EB006847, EB007942, and EB015896 awarded by the National Institutes of Health. The government has certain rights in the invention.

BACKGROUND OF THE INVENTION

The field of the invention is systems and method for magnetic resonance imaging ("MRI"). More particularly, the invention relates to systems and methods for designing parallel transmission ("pTx") radio frequency ("RF") pulses for use in multislice MRI applications.

Parallel transmission RF pulse design methods have been proposed that allow uniform excitation of spins across the field of view and excitation of specific patterns "burnt" into the patient. Electromagnetic ("EM") simulations of such pulses have shown that the interference of electric fields created by every channel deposit a large amount of energy, as measured by the specific absorption rate ("SAR" expressed in W/kg), at focal locations in the body. When not controlling local SAR explicitly in the pTx pulse design process (i.e. when controlling global SAR or pulse power), local SAR in pTx is often found to be 5 to 10 times greater than in single channel excitations. Another difficulty is that, in contrast to single channel excitation, the ratio of local to global SAR is not constant and depends on the pTx pulse being played. Therefore, both global and local SAR have to be monitored explicitly in pTx experiments.

Explicit control of local SAR in pTx is difficult because, in theory, it requires monitoring SAR at hundreds of thousands of locations in the body during the pulse design process and the actual scan. A pulse design algorithm that explicitly incorporates local SAR, global SAR, and peak and average power constraints has been proposed by D. O. Brunner and K. P. Pruessmann in "Optimal design of multiple channel RF pulses under strict power and SAR constraints," *Magnetic Resonance in Medicine*, 2010; 63(5): 1280-1291; however, this study only showed a proof of concept by controlling SAR at a few locations in the body.

J. Lee, et al., proposed an approach that controls local SAR at a limited number of "virtual observation points" ("VOPs"), as described in "Local SAR in parallel transmission pulse design," *Magnetic Resonance in Medicine*, 2012; 67(6):1566-78. In this method, fast computational control of local SAR in the entire body is achieved by using a reduced number of SAR constraints. This approach is not optimal, however, because it is based on an approximation of local SAR as a linear combination of the SAR values associated to all VOPs. In other words, it is possible to find pulses that have a better local SAR versus excitation fidelity than those found by this algorithm. Another limitation of this method is that it is not capable of incorporating other constraints than local SAR (e.g. global SAR and/or pulse power).

Another class of approaches for reducing local SAR at constant excitation error includes using distinct RF pulses instead of only one RF pulse, as is done conventionally. Such RF pulses can be designed so that they have cancelling SAR hotspot locations and, therefore, an overall six minutes average local SAR that is significantly lower than the local SAR of individual pulses. This is motivated by the fact that the FDA regulates only the six minutes average of local and global SAR, not instantaneous SAR. This type of local SAR reduction technique can be referred to as "SAR hopping" because it allows SAR hotspots to "hop" from pulse to pulse. A limitation of the previous approaches that make use of SAR hopping is that they do not control local SAR explicitly in the entire body, but only at a few locations. Pulses designed using this technique are, therefore, not optimal. A common problem with these approaches is that they use different pulses to excite a single slice of k-space. Since different pulses cannot have exactly the same excitation profiles, this results in ghosting and inaccurate image contrast.

It would therefore be desirable to provide a system and method for designing pTx RF pulses for multislice imaging applications that overcome the drawbacks of currently available methods, including suboptimal design performance and the inducement of ghosting artifacts.

SUMMARY OF THE INVENTION

The present invention overcomes the aforementioned drawbacks by providing a system and method for designing pTx RF pulses for use in multislice MRI applications that minimize average local SAR across the pulses using a constraint that enforces SAR hopping between excitations.

It is an aspect of the invention to provide a method for designing parallel transmission (pTx) radio frequency (RF) pulses for use in multislice magnetic resonance imaging (MRI). The method includes determining a target magnetization to be achieved in a plurality of slice locations in a subject and selecting a set of compressed specific absorption rate (SAR) matrix points at which SAR can be evaluated. By way of example, the compressed SAR matrix points can be virtual observation points (VOPs). A plurality of RF pulses for achieving the target magnetization are then designed by determining a set of RF waveforms that minimize an average local SAR of the plurality of RF pulses evaluated at the compressed SAR matrix points. The RF waveforms can also minimize a global SAR of the plurality of RF pulses evaluated at the compressed SAR matrix points, the peak power of the RF pulses on each of a plurality of transmit channels, and the average power of the RF pulses on the plurality of transmit channels.

It is another aspect of the invention to provide an MRI system that includes a magnet system, a plurality of gradient coils, an RF system, and a computer system. The magnet system is configured to generate a polarizing magnetic field about at least a portion of a subject arranged in the MRI system; the plurality of gradient coils are configured to apply at least one magnetic gradient field to the polarizing magnetic field; and the RF system includes at least one RF coil configured to apply an RF field to the subject and to receive magnetic resonance signals therefrom. The computer system is programmed to determine a target magnetization to be achieved in a plurality of slice locations in the subject; select a set of compressed SAR matrix points at which SAR can be evaluated; determine a set of RF waveforms that minimize an average local SAR of a plurality of RF pulses evaluated at the compressed SAR matrix points using a constrained optimization; and direct the RF system to produce the plurality of RF pulses using the determined set of RF waveforms, such that the determined target magnetization is generated in the plurality of slice locations in the subject.

The foregoing and other aspects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION OF THE INVENTION

Figure 1:
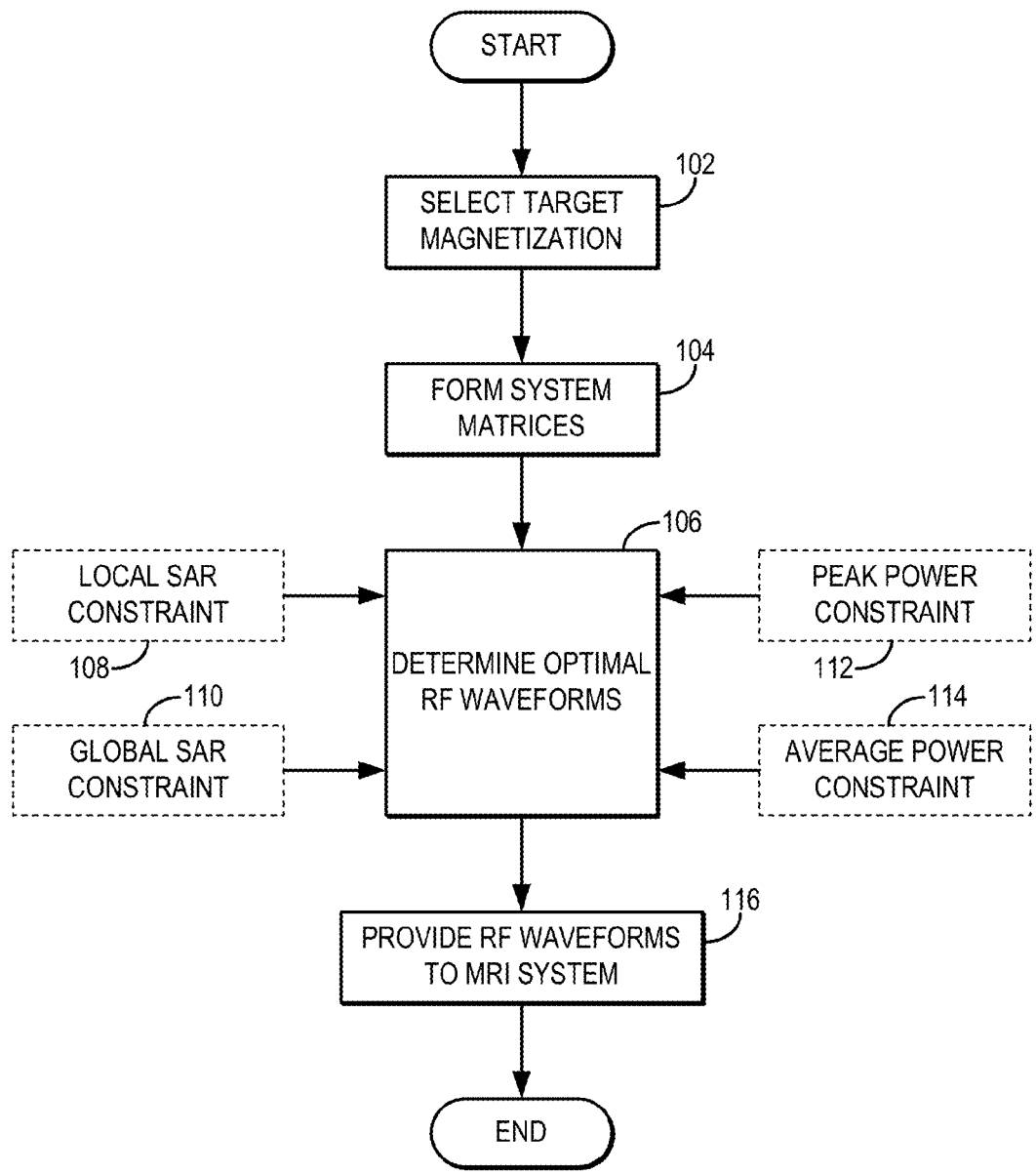
FIG. 1 is a flowchart setting forth the steps of an example of a method for designing parallel transmission RF pulses for multislice MRI applications.

Described here are a system and method for designing radio frequency ("RF") pulses for parallel transmission ("pTx") applications, and particularly pTx applications in multislice magnetic resonance imaging ("MRI"). The present invention implements the concept of "SAR hopping" by framing the concept between slice-selective excitations as a constrained optimization problem that attempts designing multiple pulses simultaneously subject to an overall local SAR constraint. That is, the present invention does not "force" the algorithm to shift SAR hotspots from pulse to pulse. Instead, the algorithm automatically finds the set of RF waveforms that yield the best excitation profiles for all pulses (slices) while ensuring that the local SAR of the average of all pulses is below the regulatory limit imposed by the FDA. This approach designs all pulses simultaneously while constraining local SAR, global SAR, and peak and average power explicitly and, therefore, yields pulses that achieve optimal tradeoffs between local and global SAR, pulse power, and excitation fidelity. Ghosting artifacts and inaccurate image contrast are avoided by designing pulses that excite different slices as opposed to different k-space lines. In this approach, a given slice is excited using the same pulse.

The present invention includes two different pTx RF pulse design modules that allow for the reduction of local SAR at constant excitation error. The first constrains local SAR explicitly in the pulse design process. This constraint is achieved by compressing the SAR matrices at every location in the body to a much smaller set of compressed SAR matrix points, which may be virtual observation points ("VOPs"). Pulses are then designed that minimize excitation error while ensuring that the local SAR, global SAR, and peak and average power on each channel are below limits set by the user. This approach does not use regularization parameters that indirectly control the tradeoff between SAR, power and excitation fidelity (soft constraints). Instead it enforces SAR and power limits explicitly (hard constraints). This feature of the present invention simplifies the task of the operator and improves image quality by automatically finding optimal tradeoffs between local SAR, global SAR, peak and average pulse power, and excitation fidelity.

The second module simultaneously designs multiple pulses that have cancelling SAR hotspot locations. This design constraint may be referred to as "SAR hopping" because it allows SAR hotspots to "hop" from pulse to pulse. Excitation strategies that allow the reduction of the six minute average local SAR based on the design of multiple pulses with cancelling SAR hotspots locations have been proposed before. These methods, however, are limited by sub-optimality and image ghosting. The present invention overcomes these limitations. First, the "SAR hopping" concept is framed as an optimization problem over the RF waveforms of all pulses simultaneously while explicitly constraining the local SAR of the average of all pulses. In other words, multiple RF waveforms are designed such that they minimize the overall mean square error of all pulses while guaranteeing that the six minutes average local SAR of these pulses is below the regulatory limit.

Thus, the present invention explicitly controls local SAR, global SAR, peak power, and average power on every transmit channel simultaneously. Local SAR is also controlled in the entire body by compressing the SAR matrices at every location into a dramatically smaller set of compressed SAR matrix points. Unlike previous techniques, the present invention is mathematically optimal in that it yields pulses that achieve the best possible tradeoff between local and global SAR, peak and average power, and excitation fidelity. The present invention does not depend on regularization parameters that indirectly control tradeoffs between SAR, power, and fidelity; instead, it explicitly enforces the global and local SAR as well as power limits. This simplifies the task of the operator and could potentially improve image quality by automatically finding optimal tradeoffs between local SAR, global SAR, peak and average power as well as excitation fidelity.

When using several transmit channels to excite the MR signal, SAR at location, r, is computed from the knowledge of the electric fields $E_1(r), \ldots, E_C(r)$ created by the C transmit channels; the RF waveforms played on each of these channels; the conductivity, $\sigma(r)$; and density $\rho(r)$, according to the following:

$$SAR(r) = \frac{\sigma(r)}{2\rho(r)} \frac{1}{T} \int_0^T \left\| \sum_{c=1}^C E_c(r,t) \right\|^2 dt; \qquad (1)$$

which can be approximated as $$SAR(r) \approx \frac{\sigma(r)}{2\rho(r)} \frac{1}{N_T} \sum_{i=1}^{N_T} rf(i\Delta t)^H Q(r) rf(i\Delta t). \qquad (2)$$

In Eqn. (2), $rf(i\Delta t)$ is the vertical concatenation of RF values played on all channels at time $i\Delta t$; $\{\ldots\}^H$ indicates the Hermitian transpose operator; T is the pulse length; $N_T$ is the number of RF samples; and $Q(r)$ is the correlation matrix of electric fields created by all channels at the location, r. SAR averaging over a given volume (e.g., a ten gram or one gram volume) as prescribed by the FDA can be done at the level of the correlation matrices, $Q(r)$ by summing the original matrices contained in the averaging volume. Eqn. (2) is thus valid even when performing SAR averaging. The material properties and other constants are incorporated in the definition of the correlation matrix, Q(r) to simplify notations.

In theory, explicit control for local SAR in the design of MRI pulses should be performed by controlling SAR at every position, r, of the body model used to compute the electric fields. Assuming an average tissue density of 1000 kg/m$^3$ body, 1 g (10 g) of tissue corresponds to a volume $10^{-6}$ m$^3$ ($10^{-5}$ m$^3$). For the averaging process to be reasonably accurate, at least 50 Q-matrices would need to be summed, which means that the linear resolution of the body model would need to be at least 2.7 mm (5.8 mm). At these resolutions, typical body models contain hundreds of thousands of voxels. Controlling SAR at so many locations would make the pulse design process extremely slow and, therefore, not applicable in the clinic. To solve this problem, the method of the present invention controls SAR in the entire body using a compression of the original SAR matrices, SAR (r) to reduce the number of evaluation points. By way of example, one method for compressing the SAR matrices, SAR(r) can include forming a significantly smaller set of virtual observation points ("VOPs"). The compression of the SAR matrices, SAR(r), can be carried out as described by G. Eichfelder and M. Gebhardt in "Local specific absorption rate control for parallel transmission by virtual observation points," *Magnetic Resonance in Medicine*, 2011; 66(5): 1468-1476. The VOP compression scheme allows for the reduction of the number of SAR matrices by a factor of 300 or more, while ensuring that the local SAR estimation error associated with the compression process is an overestimation. The safety margin afforded by this overestimation is a beneficial feature of the algorithm. Another example of how the SAR matrices, SAR (r), can be compressed is to use the compression method described by A. Sbrizzi, et al., in "Fast design of local N-gram specific absorption rate-optimized radiofrequency pulses for parallel transmit systems," *Magnetic Resonance in Medicine*, 2012; 67(3):824-834. Unlike the VOP method, this compression technique does not guarantee that the SAR error is an overestimation. Although the succeeding description is provided with respect to using VOPs, it will be appreciated by those skilled in the art that the VOPs can be readily exchanged with other compressed samplings of the SAR matrices, SAR (r).

Other popular model reduction methods, like truncated SVD, could be used to reduce the number of SAR matrices, but these methods typically result in local SAR estimation errors that are sometime positive and sometime negative. That is, in some cases these methods underestimate local SAR, which is potentially harmful to the patient. The local SAR overestimation error associated with the VOP compression scheme is bounded by a user-defined maximum allowed error that indirectly controls the number of VOPs. A tight control of local SAR thus requires more VOPs than a loose one.

As described above, local SAR averaged over six minutes can be reduced by designing multiple pulses that have their SAR hotspots at different locations. Such pulses, played during a six minute time interval, have a lower overall local SAR than if a single pulse was used during the same period. In order to avoid in-plane ghosting, these pulses can be used to excite different slices. This idea is implemented as an optimization problem in which multiple pulses are designed simultaneously and the local SAR of the average of all pulses is constrained explicitly using compressed SAR matrix points, such as VOPs, $$\min_x \|Ax - b\|_2^2; \quad (3)$$

where x and b are the concatenation of the RF waveforms and the target magnetizations, respectively, of all pulses being designed simultaneously. Similarly, the system matrix, A, is the block diagonal of the system matrices corresponding to individual pulses. These individual system matrices can be computed from the small flip angle magnetic resonance signal equation as follows, $$[A_p]_{i,(jc)} = i\gamma m_0(r_i) S_c(r_i) e^{-2\pi i k(j\Delta t)\cdot r_i}, \quad (4);$$

where $A_p$ is the system matrix of the $p^{th}$ pulse; $\gamma$ is the proton gyromagnetic ratio; $m_0(r_i)$ is the steady state magnetization at location $r_i$; $S_c(r_i)$ is the B1+ transmit pulse profile of the $c^{th}$ transmit channel at location $r_i$; and k(t) is the transmit k-space trajectory.

The optimization problem of Eqn. (3) is constrained by the following constraints:

$$\sum_{i=1}^{N_T} x(i\Delta t)^H S_j x(i\Delta t) \le SAR_{local}; \quad (5)$$

$$\sum_{i=1}^{N_T} x(i\Delta t)^H \langle S \rangle x(i\Delta t) \le SAR_{global}; \quad (6)$$

$$|x_c(i\Delta t)|^2 \le P_{peak}; \quad (7)$$

and $$\sum_{i=1}^{N_T} |x_c(i\Delta t)|^2 \le P_{avg}. \quad (8)$$

These constraints can be described as follows: Eqn. (5) constrains local SAR at every compressed SAR matrix point; Eqn. (6) constrains global SAR; Eqn. (7) constrains peak power for each channel; and Eqn. (8) constrains average power on every channel. As described above, the local SAR of the average of all pulses is being constrained in the present invention, and not the local SAR of each pulse individually. In doing so, the SAR hopping concept is enforced as a constraint in the pulse design process. The many-pulses SAR kernel, $S_j$, is the block diagonal matrix, $$S_j = \frac{1}{P} \begin{bmatrix} VOP_j & 0 & 0 \\ 0 & \ddots & 0 \\ 0 & 0 & VOP_j \end{bmatrix}; \quad (9)$$

where P is the number of pulses being designed. As mentioned earlier, x(t) is the concatenation of the RF values played on every channel and all pulses at time, t. As such, the constraint defined by Eqn. (5) represents the SAR value averaged over all pulses associated with the $j^{th}$ VOP. When a SAR compression method other than the VOP method is used, the compressed SAR matrix samplings will replace the $VOP_j$ terms in Eqn. (9).

The optimization problem in Eqn. (3) subject to the constraints of Eqns. (5)-(8) is convex. Notably, the least squares objective is convex and the constraints define a convex set because all SAR matrices are semi-definite positive. To solve this optimization problem, a primal/dual interior point algorithm, such as the one described by S. P. Boyd and L. Vandenberghe in *Convex Optimization* (Cambridge Univ. Press, 2004) can be used. In spokes pulses, the number of unknowns (e.g., the spokes amplitudes) is typically small (e.g., ≤100) whereas the number of SAR and power constraints is typically large (e.g., ≥1000). Therefore, each Newton iteration of the primal/dual procedure can be solved exactly using a Schur complement, which is a square matrix of size equal to the number of unknowns. Using the Schur complements allows for exact and fast inversion. The convergence of the primal/dual iterations can be tuned by using a Karush-Kuhn-Tucker relaxation parameter that is iteration dependent. For instance, a large relaxation can be used when constraints are active and almost no relaxation can be used when no constraint is active.

Referring now to FIG. 1, a flowchart setting forth the steps of an example of a method for designing parallel transmission RF pulses for multislice MRI applications is illustrated. The method begins with the selection of a target magnetization, b, to be achieved in two or more slice locations during the multislice imaging application, as indicated at step 102. A system matrix, A, is then formed, as indicated at step 104. By way of example, the system matrix, A, can be formed in accordance with a small tip angle magnetic resonance signal model, such as the one in Eqn. (4). This step may thus include providing B1+ sensitivity maps, which can be obtained using any number of methods known in the art. Similarly, this step may include providing transmit k-space trajectories, such as spokes trajectories.

Using the target magnetization, b, and the system matrix, A, a set of optimal RF waveforms is determined, as indicated at step 106. Preferably, these RF waveforms are determined using the optimization problem set forth in Eqn. (3). This optimization is constrained using one or more of the following constraints: a local SAR constraint, as indicated at 108 and described above in Eqn. (5); a global SAR constraint, as indicated at 110 and described above in Eqn. (6); a peak power constraint, as indicated at 112 and described above in Eqn. (7); and an average power constrain, as indicated at 114 and described above in Eqn. (8). It is noted again that the local SAR constraint 108 is a constraint on the average local SAR attributable to all of the simultaneously designed RF pulses, and not the local SAR attributable to each RF pulse in isolation. This constraint thus automatically enforces the SAR hopping concept described above. In addition, it is noted that the local SAR constraint 108 and the global SAR constraint 110 are assessed at compressed SAR matrix points, which may be VOPs, thereby reducing the computational complexity of the RF design process.

The method thus proceeds by providing the determined optimal RF waveforms to an MRI system, as indicated at step 116. The MRI system is then capable of employing these RF waveforms to produce pTx RF pulses to achieve the target magnetization in multiple slice locations in accordance with the desired multislice imaging application.

Figure 2:
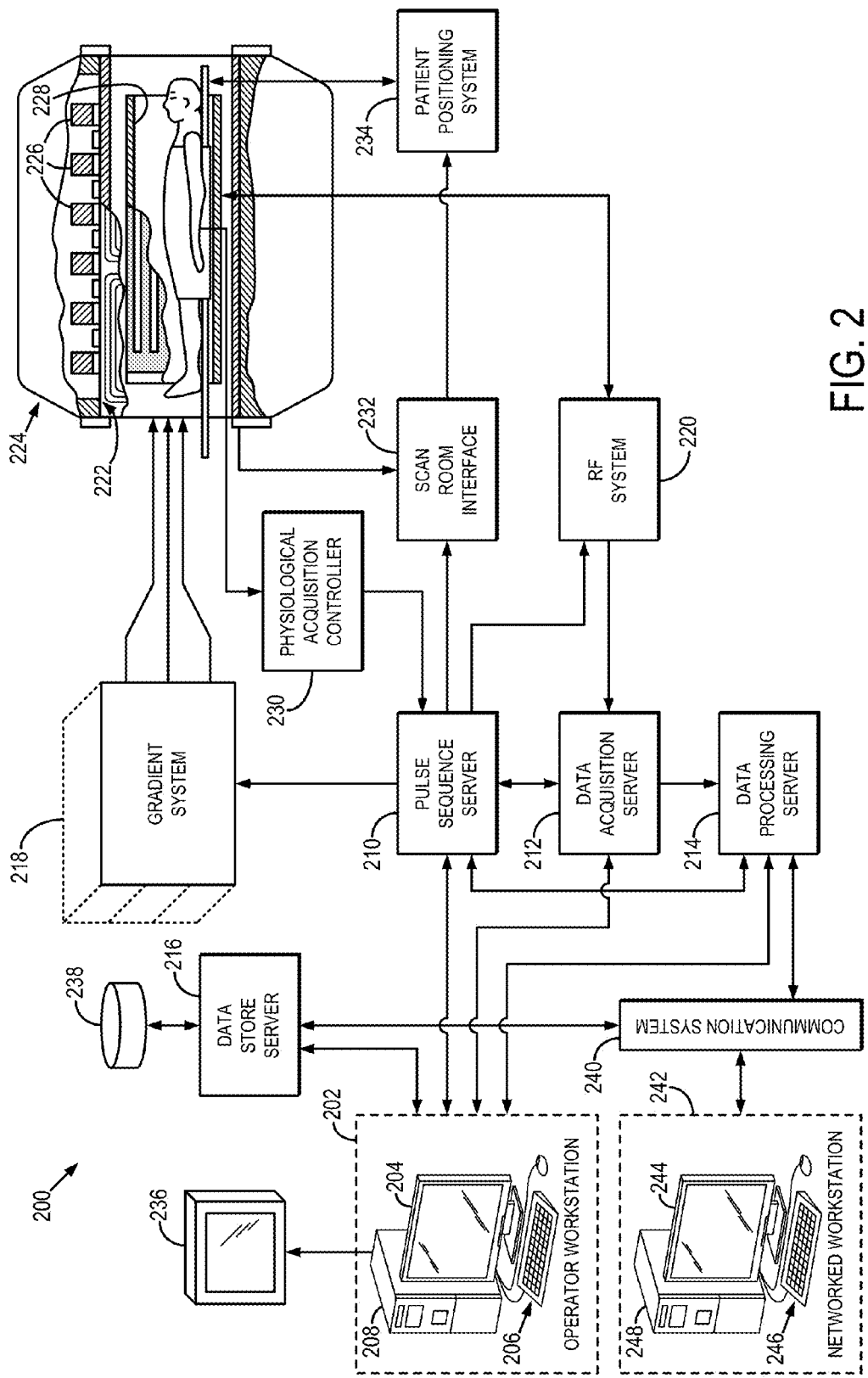
FIG. 2 is a block diagram of an example of an MRI system that can implement the present invention.

Referring particularly now to FIG. 2, an example of a magnetic resonance imaging ("MRI") system 200 that can implement the present invention is illustrated. The MRI system 200 includes an operator workstation 202, which will typically include a display 204; one or more input devices 206, such as a keyboard and mouse; and a processor 208. The processor 208 may include a commercially available programmable machine running a commercially available operating system. The operator workstation 202 provides the operator interface that enables scan prescriptions to be entered into the MRI system 200. In general, the operator workstation 202 may be coupled to four servers: a pulse sequence server 210; a data acquisition server 212; a data processing server 214; and a data store server 216. The operator workstation 202 and each server 210, 212, 214, and 216 are connected to communicate with each other. For example, the servers 210, 212, 214, and 216 may be connected via a communication system 240, which may include any suitable network connection, whether wired, wireless, or a combination of both. As an example, the communication system 240 may include both proprietary or dedicated networks, as well as open networks, such as the internet.

The pulse sequence server 210 functions in response to instructions downloaded from the operator workstation 202 to operate a gradient system 218 and a radiofrequency ("RF") system 220. Gradient waveforms necessary to perform the prescribed scan are produced and applied to the gradient system 218, which excites gradient coils in an assembly 222 to produce the magnetic field gradients $G_x$, $G_y$, and $G_z$ used for position encoding magnetic resonance signals. The gradient coil assembly 222 forms part of a magnet assembly 224 that includes a polarizing magnet 226 and a whole-body RF coil 228. The whole-body RF coil 228 may include a single-channel transmit coil or a multiple-channel transmit coil array that is capable of implementing the method of the present invention. For instance, the whole-body RF coil 228 may include a two channel transmit coil array.

RF waveforms are applied by the RF system 220 to the RF coil 228, or a separate local coil (not shown in FIG. 2), in order to perform the prescribed magnetic resonance pulse sequence. Responsive magnetic resonance signals detected by the RF coil 228, or a separate local coil (not shown in FIG. 2), are received by the RF system 220, where they are amplified, demodulated, filtered, and digitized under direction of commands produced by the pulse sequence server 210. The RF system 220 includes one or more RF transmitters for producing a wide variety of RF pulses used in MRI pulse sequences. The RF transmitter is responsive to the scan prescription and direction from the pulse sequence server 210 to produce RF pulses of the desired frequency, phase, and pulse amplitude waveform. The generated RF pulses may be applied to the whole-body RF coil 228 or to one or more local coils or coil arrays (not shown in FIG. 2).

The RF system 220 also includes one or more RF receiver channels. Each RF receiver channel includes an RF preamplifier that amplifies the magnetic resonance signal received by the coil 228 to which it is connected, and a detector that detects and digitizes the I and Q quadrature components of the received magnetic resonance signal. The magnitude of the received magnetic resonance signal may, therefore, be determined at any sampled point by the square root of the sum of the squares of the I and Q components:

$$M=\sqrt{I^2+Q^2} \qquad (10);$$

and the phase of the received magnetic resonance signal may also be determined according to the following relationship:

$$\varphi = \tan^{-1}\left(\frac{Q}{I}\right). \qquad (11)$$

The pulse sequence server 210 also optionally receives patient data from a physiological acquisition controller 230. By way of example, the physiological acquisition controller 230 may receive signals from a number of different sensors connected to the patient, such as electrocardiograph ("ECG")

signals from electrodes, or respiratory signals from a respiratory bellows or other respiratory monitoring device. Such signals are typically used by the pulse sequence server 210 to synchronize, or "gate," the performance of the scan with the subject's heart beat or respiration.

The pulse sequence server 210 also connects to a scan room interface circuit 232 that receives signals from various sensors associated with the condition of the patient and the magnet system. It is also through the scan room interface circuit 232 that a patient positioning system 234 receives commands to move the patient to desired positions during the scan.

The digitized magnetic resonance signal samples produced by the RF system 220 are received by the data acquisition server 212. The data acquisition server 212 operates in response to instructions downloaded from the operator workstation 202 to receive the real-time magnetic resonance data and provide buffer storage, such that no data is lost by data overrun. In some scans, the data acquisition server 212 does little more than pass the acquired magnetic resonance data to the data processor server 214. However, in scans that require information derived from acquired magnetic resonance data to control the further performance of the scan, the data acquisition server 212 is programmed to produce such information and convey it to the pulse sequence server 210. For example, during prescans, magnetic resonance data is acquired and used to calibrate the pulse sequence performed by the pulse sequence server 210. As another example, navigator signals may be acquired and used to adjust the operating parameters of the RF system 220 or the gradient system 218, or to control the view order in which k-space is sampled. In still another example, the data acquisition server 212 may also be employed to process magnetic resonance signals used to detect the arrival of a contrast agent in a magnetic resonance angiography ("MRA") scan. By way of example, the data acquisition server 212 acquires magnetic resonance data and processes it in real-time to produce information that is used to control the scan.

The data processing server 214 receives magnetic resonance data from the data acquisition server 212 and processes it in accordance with instructions downloaded from the operator workstation 202. Such processing may, for example, include one or more of the following: reconstructing two-dimensional or three-dimensional images by performing a Fourier transformation of raw k-space data; performing other image reconstruction algorithms, such as iterative or back-projection reconstruction algorithms; applying filters to raw k-space data or to reconstructed images; generating functional magnetic resonance images; calculating motion or flow images; and so on.

Images reconstructed by the data processing server 214 are conveyed back to the operator workstation 202 where they are stored. Real-time images are stored in a data base memory cache (not shown in FIG. 2), from which they may be output to operator display 212 or a display 236 that is located near the magnet assembly 224 for use by attending physicians. Batch mode images or selected real time images are stored in a host database on disc storage 238. When such images have been reconstructed and transferred to storage, the data processing server 214 notifies the data store server 216 on the operator workstation 202. The operator workstation 202 may be used by an operator to archive the images, produce films, or send the images via a network to other facilities.

The MRI system 200 may also include one or more networked workstations 242. By way of example, a networked workstation 242 may include a display 244; one or more input devices 246, such as a keyboard and mouse; and a processor 248. The networked workstation 242 may be located within the same facility as the operator workstation 202, or in a different facility, such as a different healthcare institution or clinic.

The networked workstation 242, whether within the same facility or in a different facility as the operator workstation 202, may gain remote access to the data processing server 214 or data store server 216 via the communication system 240. Accordingly, multiple networked workstations 242 may have access to the data processing server 214 and the data store server 216. In this manner, magnetic resonance data, reconstructed images, or other data may be exchanged between the data processing server 214 or the data store server 216 and the networked workstations 242, such that the data or images may be remotely processed by a networked workstation 242. This data may be exchanged in any suitable format, such as in accordance with the transmission control protocol ("TCP"), the internet protocol ("IP"), or other known or suitable protocols.

Figure 3:
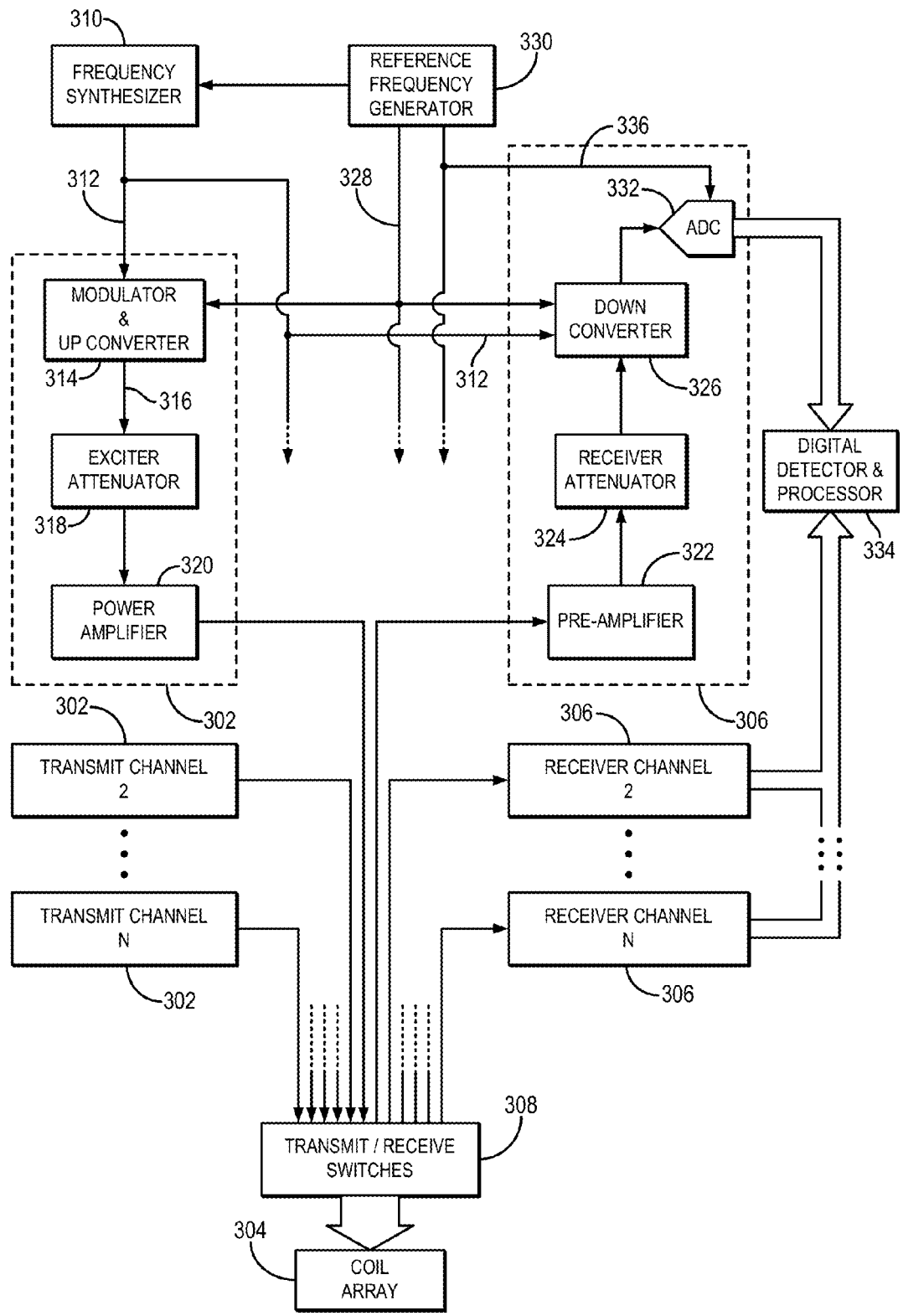
FIG. 3 is a block diagram of an example of a parallel transmit and receive RF system that can form a part of the MRI system of FIG. 2.

As shown in FIG. 2, the RF system 220 may be connected to the whole-body RF coil 228, or, as shown in FIG. 3, a transmission section of the RF system 220 may connect to one or more transmit channels 302 of an RF coil array 304 and a receiver section of the RF system 220 may connect to one or more receiver channels 306 of the RF coil array 304. The transmit channels 302 and the receiver channels 306 are connected to the RF coil array 304 by way of one or more transmit/receive ("T/R") switches 308. In alternative configurations of the RF system 228 in which the receive coils are a separate collection of coils than the transmit coils, T/R switches 308 are not needed and are not used. Instead, in such a configuration the receive array is "detuned" during transmission so that it does not couple to the transmitter. Likewise, during reception, the transmitter is detuned. In this manner, the transmit and receive paths do not mix.

Referring particularly to FIG. 3, the RF system 220 includes one or more transmit channels 302 that produce a prescribed RF excitation field. The base, or carrier, frequency of this RF excitation field is produced under control of a frequency synthesizer 310 that receives a set of digital signals from the pulse sequence server 210. These digital signals indicate the frequency and phase of the RF carrier signal produced at an output 312. The RF carrier is applied to a modulator and up converter 314 where its amplitude is modulated in response to a signal, R(t), also received from the pulse sequence server 210. The signal, R(t), defines the envelope of the RF excitation pulse to be produced and is produced by sequentially reading out a series of stored digital values. These stored digital values may be changed to enable any desired RF pulse envelope to be produced.

The magnitude of the RF excitation pulse produced at output 316 may be attenuated by an exciter attenuator circuit 318 that receives a digital command from the pulse sequence server 210. The attenuated RF excitation pulses are then applied to a power amplifier 320 that drives the RF coil array 304.

The MR signal produced by the subject is picked up by the RF coil array 302 and applied to the inputs of the set of receiver channels 306. A preamplifier 322 in each receiver channel 306 amplifies the signal, which is then attenuated by a receiver attenuator 324 by an amount determined by a digital attenuation signal received from the pulse sequence server 210. The received signal is at or around the Larmor frequency, and this high frequency signal is down converted in a two step process by a down converter 326. The down converter 326 first mixes the MR signal with the carrier signal on line 312 and then mixes the resulting difference signal with a reference signal on line 328 that is produced by a reference frequency generator 330. The down converted MR signal is applied to the input of an analog-to-digital ("A/D") converter 332 that samples and digitizes the analog signal. As an alternative to down conversion of the high frequency signal, the received analog signal can also be detected directly with an appropriately fast analog-to-digital ("A/D") converter and/or with appropriate undersampling. The sampled and digitized signal is then applied to a digital detector and signal processor 334 that produces 16-bit in-phase (I) values and 16-bit quadrature (Q) values corresponding to the received signal. The resulting stream of digitized I and Q values of the received signal are output to the data acquisition server 212. In addition to generating the reference signal on line 328, the reference frequency generator 330 also generates a sampling signal on line 336 that is applied to the A/D converter 332.

Thus, a method for designing pTx RF pulses that allows generating slice selective pulses capable of creating highly uniform excitation patterns at multiple slice locations while creating negligible SAR deposition in the patient (<10 W/kg @ 100% duty cycle) has been provided. The method includes designing multiple RF pulses simultaneously subject to local SAR constraints for the average of all pulses, thereby enforcing "SAR hopping". The method is fast enough (e.g., designing a pair of 2-spokes pulses in 23 seconds) to be used in clinic.

The method of the present invention improves upon other RF pulse design method by accounting for ghosting artifacts and sub-optimality. Previous "SAR hopping" techniques, such as those described by I. Graesslin, et al., in "Local SAR constrained hotspot reduction by temporal averaging," *Proceedings of the International Society for Magnetic Resonance in Medicine*, Stockholm, Sweden, 4932, produce ghosting artifacts and inaccurate image contrast because distinct pulses are used to acquire a single slice of k-space data. Because it is not possible to design pulses with exactly the same excitation phase profiles, phase variation between the excitation of different k-space lines creates ghosting. Moreover, variations in the magnitude of the excitation profiles of different pulses create a varying flip-angle weighting between excitations and therefore introduce inaccurate contrast in reconstructed images. These difficulties are overcome by designing multiple pulses exciting multiple slices. That is, the RF pulses designed using the method of the present invention are implemented in multi-slice acquisition strategies using slice selective excitation pulses. In this approach, a given slice is always excited using the same pulse and is therefore free of ghosting artifacts and inaccurate image contrast.

Sub-optimality refers to the fact that the currently available RF pulse design techniques yield pulses that, in general, do not achieve the best possible tradeoff between local SAR and excitation fidelity. This is because these techniques do not explicitly control local SAR in the pulse design process, nor do they design all pulses simultaneously within a single optimization scheme. The method of the present invention, however, is optimal because it designs multiple pulses simultaneously while explicitly constraining the local SAR of the average of all pulses. Because the resulting optimization problem is convex and a convergent algorithm is used to solve it, the pulses computed with this technique achieve an optimal tradeoff between the local SAR of all the pulses and excitation fidelity.

It is noted again that an advantageous feature of the present invention is that local SAR is constrained explicitly in the pulse design process. This is in contrast with most previous techniques, which have focused on regularization of global SAR or average pulse power. This feature of the present invention is achieved in part by compressing the SAR matrices at all locations in the body to a dramatically smaller set of compressed SAR matrix points, which may be VOPs. Using this more manageable set of SAR matrices, pulses can be designed with explicit local SAR constraints within reasonable computation time. Note that a constrained optimization algorithm can be used to calculate least square pulses that satisfy simultaneous constraints on local SAR (via compressed SAR matrix points), global SAR, average power on every channel, and peak power on every channel. This is in contrast with regularized pulse design strategies that indirectly control the tradeoff between SAR, power, and fidelity via regularization parameters that the user needs to determine (soft constraints). The method of the present invention does not depend on regularization parameters; instead, SAR and power limits are explicitly enforced (hard constraints). This feature of the pulse design algorithm considerably simplifies the task of the operator during in vivo scans and improves the quality of images by automatically finding optimal tradeoffs between local SAR, global SAR, peak and average pulse power, and excitation fidelity.

The two pulse design modules described herein (explicit local SAR control and "SAR hopping") can also be used independently. Used individually, they allow reducing local SAR at constant excitation error by twenty percent ("SAR hopping") and sixty-four percent (local SAR control). Used in combination, they allow reducing local SAR at constant excitation error by seventy-seven percent compared to only constraining global SAR.

The present invention has been described in terms of one or more preferred embodiments, and it should be appreciated that many equivalents, alternatives, variations, and modifications, aside from those expressly stated, are possible and within the scope of the invention.

The invention claimed is:

1. A method for designing parallel transmission (pTx) radio frequency (RF) pulses for use in multislice magnetic resonance imaging (MRI), the steps of the method comprising:
  a) determining a target magnetization to be achieved in a plurality of slice locations in a subject;
  b) selecting a set of compressed specific absorption rate (SAR) matrix points at which SAR can be evaluated;
  c) designing a plurality of RF pulses for achieving the target magnetization by determining a set of RF waveforms that minimize an average local SAR of the plurality of RF pulses evaluated at the compressed SAR matrix points; and d) making the plurality of RF pulses designed in step c) accessible to an MRI system to perform multislice MRI.

2. The method as recited in claim 1 in which the selected set of compressed SAR matrix points define a sparse sampling of SAR matrices.

3. The method as recited in claim 1 in which step c) includes minimizing the average local SAR of the plurality of RF pulses evaluated at the compressed SAR matrix points using a constraint defined as, $$\sum_{i=1}^{N_T} x(i\Delta t)^H S_j x(i\Delta t) \leq SAR_{local};$$

wherein $x(i\Delta t)$ is a vector including a concatenation of the RF waveforms evaluated at sample points, $i\Delta t$; $\{\ldots\}^H$ indicated a Hermitian transpose operation; $S_j$ is a matrix of SAR kernels; $N_T$ is a number of sample points in the concatenation of the RF waveforms; and $SAR_{local}$ is a local SAR threshold.

4. The method as recited in claim 3 in which the matrix of SAR kernels, $S_j$, is a block diagonal matrix.

5. The method as recited in claim 1 in which the set of RF waveforms determined in step c) also minimize a global SAR of each RF pulse evaluated at the compressed SAR matrix points.

6. The method as recited in claim 1 in which the set of RF waveforms determined in step c) also minimize a peak power in each of a plurality of transmit channels.

7. The method as recited in claim 1 in which the set of RF waveforms determined in step c) also minimize an average power in each of a plurality of transmit channels.

8. The method as recited in claim 1 in which the set of RF waveforms determined in step c) also minimize a global SAR of each RF pulse evaluated at the compressed SAR matrix points, a peak power in each of a plurality of transmit channels, and an average power in each of a plurality of transmit channels.

9. The method as recited in claim 1 in which step b) includes selecting the set of compressed SAR matrix points using a method that defines the compressed SAR matrix points as virtual observation points (VOPs).

10. A method for designing parallel transmission (pTx) radio frequency (RF) pulses for use in multislice magnetic resonance imaging (MRI), the steps of the method comprising:
   a) determining a target magnetization to be achieved in a plurality of slice locations in a subject;
   b) selecting a set of compressed specific absorption rate (SAR) matrix points at which SAR can be evaluated;
   c) designing a plurality of RF pulses for achieving the target magnetization by determining a set of RF waveforms that minimize an average local SAR of the plurality of RF pulses evaluated at the compressed SAR matrix points;
   in which step c) includes minimizing an objective function that comprises a least squares difference between the determined target magnetization and the set of RF waveforms after applying to the set of RF waveforms, a system matrix that describe magnetic resonance signals generated in response to RF energy; and in which the plurality of RF pulses is stored on a storage medium to be executed by an MRI system to perform the multislice MRI.

11. The method as recited in claim 10 in which the system matrix includes a small flip angle magnetic resonance signal model.

12. A magnetic resonance imaging (MRI) system, comprising:
   a magnet system configured to generate a polarizing magnetic field about at least a portion of a subject arranged in the MRI system;
   a plurality of gradient coils configured to apply at least one magnetic gradient field to the polarizing magnetic field;
   a radio frequency (RF) system including at least one RF coil configured to apply an RF field to the subject and to receive magnetic resonance signals therefrom;
   a computer system programmed to:
      determine a target magnetization to be achieved in a plurality of slice locations in the subject;
      select a set of compressed specific absorption rate (SAR) matrix points at which SAR can be evaluated;
      determine a set of RF waveforms that minimize an average local SAR of a plurality of RF pulses evaluated at the compressed SAR matrix points using a constrained optimization; and
      direct the RF system to produce the plurality of RF pulses using the determined set of RF waveforms, such that the determined target magnetization is generated in the plurality of slice locations in the subject.

13. The MRI system as recited in claim 12 in which the computer system is programmed to select the set of compressed SAR matrix points to define a sparse sampling of SAR matrices.

14. The MRI system as recited in claim 13 in which the computer system is programmed to compute the compressed SAR matrix points as virtual observation points (VOPs).

15. The MRI system as recited in claim 12 in which the computer system is programmed to determine the set of RF waveforms by constraining the constrained optimization using a constraint defined as:

$$\sum_{i=1}^{N_T} x(i\Delta t)^H S_j x(i\Delta t) \leq SAR_{local};$$

wherein $x(i\Delta t)$ is a vector including a concatenation of the RF waveforms evaluated at sample points, $i\Delta t$; $\{\ldots\}^H$ indicated a Hermitian transpose operation; $S_j$ is a matrix of SAR kernels; $N_T$ is a number of sample points in the concatenation of the RF waveforms; and $SAR_{local}$ is a local SAR threshold.

16. The MRI system as recited in claim 12 in which the computer system is configured to determine the set of RF waveforms that also minimize a global SAR of each RF pulse evaluated at the compressed SAR matrix points.

17. The MRI system as recited in claim 12 in which the computer system is configured to determine the set of RF waveforms that also minimize a peak power in each of a plurality of transmit channels.

18. The MRI system as recited in claim 12 in which the computer system is configured to determine the set of RF waveforms that also minimize an average power in each of a plurality of transmit channels.

19. The MRI system as recited in claim 12 in which the computer system is configured to determine the set of RF waveforms that also minimize a global SAR of each RF pulse evaluated at the compressed SAR matrix points, a peak power in each of a plurality of transmit channels, and an average power in each of a plurality of transmit channels.

* * * * *